(12) United States Patent
Lee et al.

(10) Patent No.: US 12,063,830 B2
(45) Date of Patent: Aug. 13, 2024

(54) DISPLAY DEVICE INCLUDING A FIFTH TRANSISTOR CONNECTED BETWEEN THE POWER LINE AND THE LIGHT EMITTING DIODE

(71) Applicant: Samsung Display Co., Ltd., Yongin-Si (KR)

(72) Inventors: Donggyu Lee, Suwon-si (KR); Jihye Kim, Hwaseong-si (KR); Jin-Wook Yang, Suwon-si (KR); Jae-Hyeon Jeon, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/200,646

(22) Filed: May 23, 2023

(65) Prior Publication Data

US 2023/0301149 A1    Sep. 21, 2023

Related U.S. Application Data

(62) Division of application No. 17/166,017, filed on Feb. 3, 2021, now Pat. No. 11,696,475.

(30) Foreign Application Priority Data

Jun. 1, 2020 (KR) .......................... 10-2020-0065837

(51) Int. Cl.
*H01L 29/08* (2006.01)
*H10K 59/121* (2023.01)
*H10K 59/131* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216
(Continued)

(56) References Cited

U.S. PATENT DOCUMENTS 10,217,409 B2   2/2019   Hu et al.
10,262,585 B2   4/2019   Senda et al.
(Continued)

FOREIGN PATENT DOCUMENTS

CN   109903728 A   *   6/2019   ........... G09G 3/3233
KR   10-20050109167 A    11/2005
(Continued)

*Primary Examiner* — Phuc T Dang
(74) *Attorney, Agent, or Firm* — Innovation Counsel LLP

(57) ABSTRACT

A display device includes a display panel including a plurality of pixels. At least one of the pixel includes a light emitting diode, a first transistor connected between a power line receiving a power source voltage and an anode of the light emitting diode, a second transistor connected between a data line and a first reference node, a first capacitor connected between the power line and the first reference node, a second capacitor connected between the first reference node and a second reference node, a third transistor connected between the first refence node and a reference voltage line receiving a reference voltage, a fourth transistor connected between an initialization voltage line receiving an initialization voltage and a drain of the first transistor, and a fifth transistor connected between the drain of the first transistor and the anode of the light emitting diode.

4 Claims, 12 Drawing Sheets

(58) Field of Classification Search
USPC .......................................................... 257/40
See application file for complete search history.

(56) References Cited

U.S. PATENT DOCUMENTS

| | | |
|---|---|---|
| 10,376,786 B2 | 8/2019 | Lee et al. |
| 10,872,562 B2 | 12/2020 | Na |
| 2006/0107146 A1* | 5/2006 | Kim .................... G09G 3/3233 |
| | | 714/727 |
| 2014/0028649 A1 | 1/2014 | Kim et al. |
| 2020/0126485 A1 | 4/2020 | Moon et al. |
| 2020/0152101 A1 | 5/2020 | Li et al. |

FOREIGN PATENT DOCUMENTS

| | | | | |
|---|---|---|---|---|
| KR | 10-1446679 B1 | 11/2014 | | |
| KR | 10-20160110846 A | 9/2016 | | |
| KR | 10-2017-0076478 A | 7/2017 | | |
| KR | 10-1935563 B1 | 4/2019 | | |
| KR | 10-20190100550 A | 8/2019 | | |
| KR | 10-2033755 B1 | 10/2019 | | |
| KR | 20210043771 A * | 4/2021 | ........... H10K 59/131 |
| WO | WO-2020071826 A1 * | 4/2020 | ........... G09G 3/2014 |

\* cited by examiner

DISPLAY DEVICE INCLUDING A FIFTH TRANSISTOR CONNECTED BETWEEN THE POWER LINE AND THE LIGHT EMITTING DIODE

CROSS-REFERENCE TO RELATED APPLICATION

This application is a divisional application of U.S. patent application Ser. No. 17/166,017 filed on Feb. 3, 2021, which claims priority under 35 USC § 119 Korean Patent Application No. 10-2020-0065837, filed on Jun. 1, 2020, the contents of which are hereby incorporated by reference in its entirety.

BACKGROUND

1. Field of Disclosure

The present disclosure relates to a display device. More particularly, the present disclosure relates to a display device that prevents deterioration in display quality thereof.

2. Description of the Related Art

Various display devices that can be used to electronic device, such as televisions, mobile phones, tablet computers, navigation units, and game units, are being developed. In particular, since portable display devices use batteries, various researches are being made to reduce power consumption in the portable display devices.

One of the researches to reduce the power consumption is to decrease an operating frequency of the display device. For example, when the operating frequency decreases in a certain operating environment such as a still image display, the power consumption of the display device is reduced.

In recent years, a technique to reduce the power consumption of the display device while preventing deterioration in display quality is required.

SUMMARY

The present disclosure provides a display device capable of preventing a display quality from being deteriorated at each frequency.

Embodiments of the inventive concept provide a display device including a display panel including a plurality of pixels. At least one of the pixels includes a light emitting diode, a first transistor connected between a power line receiving a power source voltage and an anode of the light emitting diode, a second transistor connected between a data line and a first reference node, a first capacitor connected between the power line and the first reference node, a second capacitor connected between the first reference node and a second reference node, a third transistor connected between the first reference node and a reference voltage line receiving a reference voltage, a fourth transistor connected between an initialization voltage line receiving an initialization voltage and a drain of the first transistor, and a fifth transistor connected between the drain of the first transistor and the anode of the light emitting diode. The first transistor includes a source connected to the power line and a gate connected to the second reference node.

The second transistor includes a gate receiving a data write signal, a source connected to the data line, and a drain connected to the first reference node.

The third transistor includes a gate receiving a compensation scan signal, a source connected to the reference voltage line, and a drain connected to the first reference node.

A compensation period during which the compensation scan signal having a turn-on level is applied to a gate of the third transistor precedes a write period during which the data write signal having a turn-on level is applied to a gate of the second transistor in one frame.

The display device further includes a sixth transistor connected between the second reference node and the drain of the first transistor.

The sixth transistor includes a gate receiving the compensation scan signal, a source connected to the second reference node, and a drain connected to the drain of the first transistor.

The display device further includes a seventh transistor connected between the second reference node and the initialization voltage line.

The seventh transistor includes a gate receiving an initialization scan signal, a source connected to the initialization voltage line, and a drain connected to the second reference node.

An initialization period during which an initialization signal having a turn-on level is applied to a gate of the seventh transistor of the seventh transistor precedes the compensation period and the write period in the one frame.

The fourth transistor includes a gate receiving a black scan signal, a source connected to the source of the seventh transistor, and a drain connected to the drain of the first transistor.

A black period during which the black scan signal having a turn-on level is applied to a gate of the fourth transistor is between the compensation period and the write period in the one frame.

The fifth transistor includes a gate receiving a light emitting signal, a source connected to the drain of the fourth transistor, and a drain connected to the anode of the light emitting diode.

The initialization period, the compensation period, the black period, and the write period are in a non-light-emitting period of the light emitting signal in the one frame.

The initialization period, the compensation period, and the black period are in the non-light-emitting period of the light emitting signal in the one frame, the black period overlaps the non-light-emitting period and a light emitting period of the light emitting signal, and the write period overlaps the light emitting period.

The initialization period and the compensation period are in the non-light-emitting period in the one frame, the black period overlaps the light emitting period, and the write period overlaps the light emitting period.

Embodiments of the inventive concept provide a display device including a display panel including a plurality of pixels. Each of the pixels includes a light emitting diode, a capacitor connected between a power line receiving a power source voltage and a reference node, a first transistor connected between the power line and an anode of the light emitting diode, a second transistor connected between a data line and a source of the first transistor and turned on in response to a scan signal, a third transistor connected between the power line and the source of the first transistor, a fourth transistor connected between a drain of the first transistor and an initialization voltage line receiving an initialization voltage and turned on in response to an initialization scan signal, and a fifth transistor connected between the drain of the first transistor and the anode of the light emitting diode. A scan period of the scan signal precedes an initialization period of the initialization scan signal.

The first transistor includes a source connected to a drain of the second transistor and a gate connected to the reference node, the second transistor includes a gate receiving the scan signal and a source connected to the data line, and the third transistor includes a gate receiving a light emitting signal, a source connected to the power line, and a drain connected to the source of the first transistor.

The display device further includes a sixth transistor connected between the drain of the first transistor and the reference node and a seventh transistor connected between the reference node and the initialization voltage line. The fourth transistor includes a source connected to a source of the seventh transistor, a drain connected to the drain of the first transistor, and a gate receiving the initialization scan signal, the fifth transistor includes a source connected to the drain of the fourth transistor and a gate receiving the light emitting signal, and the seventh transistor includes a gate receiving a previous scan signal and the source connected to the source of the fourth transistor.

The scan period precedes the initialization period, and the scan period and the initialization period are in a non-light-emitting period of the light emitting signal in one frame.

Embodiments of the inventive concept provide a display device including a display panel having a driving circuit and a light emitting diode connected to the driving circuit. The driving circuit includes a driving transistor having a gate electrode receiving a data signal from a data line, a source electrode receiving a power voltage, and a drain electrode electrically connected to an anode of the light emitting diode, a first transistor having a source electrode connected to a drain of the driving transistor, and a drain electrode connected to the anode of the light emitting diode, and a second transistor having a source electrode connected to an initialization voltage line, a drain electrode connected to the drain of the driving transistor and the source of the first transistor, and a gate electrode receiving a black scan signal.

According to the above, a luminance difference for each operating frequency of the display device may be reduced. Thus, a deterioration in display quality of the display device may be prevented.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
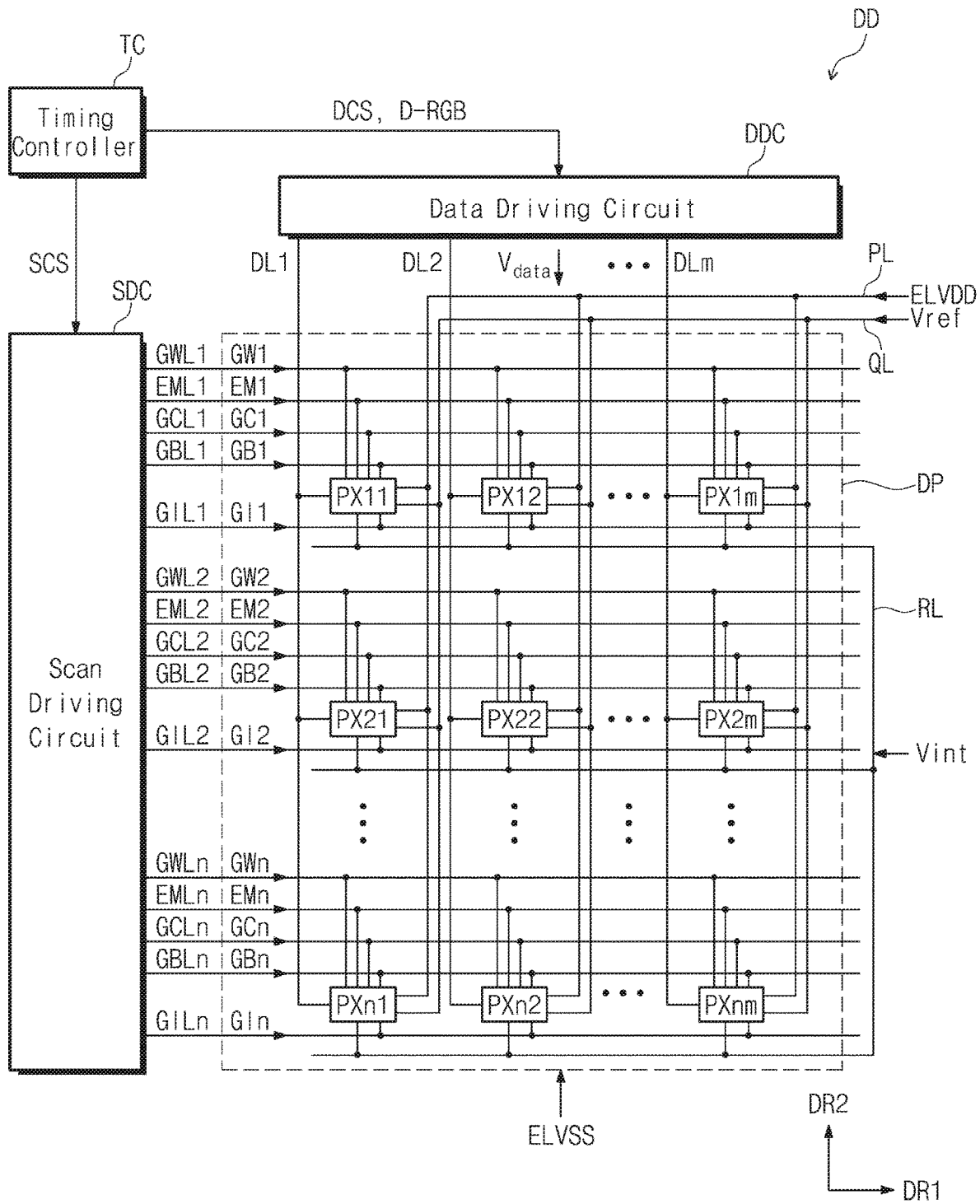
FIG. 1 is a block diagram showing a display device according to an embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

FIG. 1 is a block diagram showing a display device DD according to an embodiment of the present disclosure.

Referring to FIG. 1, the display device DD includes a timing controller TC, a scan driving circuit SDC, a data driving circuit DDC, and a display panel DP. In the present embodiment, a self-light emitting type display panel will be described as the display panel. The self-light emitting type display panel may be an organic light emitting display panel or a quantum dot light emitting display panel.

The timing controller TC receives input image signals and converts a data format of the input image signals to a data format appropriate to an interface between the data driving circuit DDC and the timing controller TC to generate image data D-RGB. The timing controller TC outputs the image data D-RGB and various control signals DCS and SCS.

The scan driving circuit SDC receives a scan control signal SCS from the timing controller TC. The scan control signal SCS includes a vertical start signal that starts an operation of the scan driving circuit SDC and a clock signal that determines an output timing of signals. The scan driving circuit SDC generates a plurality of signals GW1 to GWn, GC1 to GCn, GB1 to GBn, and GI1 to GIn and outputs the signals GW1 to GWn, GC1 to GCn, GB1 to GBn, and GI1 to GIn to corresponding signal lines GWL1 to GWLn, GCL1 to GCLn, GBL1 to GBLn, and GIL1 to GILn, respectively. In addition, the scan driving circuit SDC generates a plurality of light emitting signals EM1 to EMn in response to the scan control signal SCS and outputs the light emitting signals EM1 to EMn to corresponding light emitting lines EML1 to EMLn.

In FIG. 1, the signals GW1 to GWn, GC1 to GCn, GB1 to GBn, and GI1 to GIn and the light emitting signals EM1 to EMn are output from one scan driving circuit SDC, however, the present disclosure should not be limited thereto or thereby. According to another embodiment of the present disclosure, the display device DD may include a plurality of scan driving circuits SDC that generates and outputs part of the signals GW1 to GWn, GC1 to GCn, GB1 to GBn, and GI1 to GIn, respectively. In addition, according to another embodiment of the present disclosure, a driving circuit that generates and outputs the signals GW1 to GWn, GC1 to GCn, GB1 to GBn, and GI1 to GIn and a driving circuit that generates and outputs the light emitting signals EM1 to EMn may be provided separately from each other.

The data driving circuit DDC receives a data control signal DCS and the image data D-RGB from the timing controller TC. The data driving circuit DDC converts the image data D-RGB to data signals Vdata and outputs the data signals Vdata to data lines DL1 to DLm described later. The data signals Vdata are analog voltages corresponding to grayscale values of the image data D-RGB.

The display panel DP includes write scan lines GWL1 to GWLn, compensation scan lines GCL1 to GCLn, black scan lines GBL1 to GBLn, initialization scan lines GIL1 to GILn, light emitting lines EML1 to EMLn, the data lines DL1 to DLm, a power line PL, a reference voltage line QL, an initialization voltage line RL, and a plurality of pixels PX11 to PXnm. The write scan lines GWL1 to GWLn, the compensation scan lines GCL1 to GCLn, the black scan lines GBL1 to GBLn, the initialization scan lines GIL1 to GILn, and the light emitting lines EML1 to EMLn extend in a first direction DR1 and are arranged in a second direction DR2 crossing the first direction DR1.

The data lines DL1 to DLm are insulated from the write scan lines GWL1 to GWLn, the compensation scan lines GCL1 to GCLn, the black scan lines GBL1 to GBLn, the initialization scan lines GIL1 to GILn, and the light emitting lines EML1 to EMLn while crossing the write scan lines GWL1 to GWLn, the compensation scan lines GCL1 to GCLn, the black scan lines GBL1 to GBLn, the initialization scan lines GIL1 to GILn, and the light emitting lines EML1 to EMLn. Each of the pixels PX11 to PXnm is connected to corresponding signal lines among the signal lines GWL1 to GWLn, GCL1 to GCLn, GBL1 to GBLn, and GIL1 to GILn. A connection structure between the pixels PX11 to PXnm and the signal lines GWL1 to GWLn, GCL1 to GCLn, GBL1 to GBLn, and GIL1 to GILn may be altered depending on configurations of a driving circuit of the pixels PX11 to PXnm.

The power line PL receives a power source voltage ELVDD. The initialization voltage line RL receives an initialization voltage Vint. The reference voltage line QL receives a reference voltage Vref. The reference voltage line QL may receive the power source voltage ELVDD. The initialization voltage Vint has a voltage level lower than that of the power source voltage ELVDD. A common voltage ELVSS is applied to the display panel DP. The common voltage ELVSS has a voltage level lower than that of the power source voltage ELVDD.

In the above descriptions, the display device DD is described with reference to FIG. 1, however, the display device of the present disclosure should not be limited thereto or thereby. The signal lines GWL1 to GWLn, GCL1 to GCLn, GBL1 to GBLn, and GIL1 to GILn may be added or omitted depending on the configurations of the pixels PX11 to PXnm. In addition, the connection structure between one pixel and the signal lines GWL1 to GWLn, GCL1 to GCLn, GBL1 to GBLn, and GIL1 to GILn may be altered as needed.

The pixels PX11 to PXnm may be classified into several groups according to color of light that the pixels PX11 to PXnm emit. For instance, the pixels PX11 to PXnm include red pixels generating red light, green pixels generating green light, and blue pixels generating blue light. The light emitting diodes of the red pixels, the light emitting diodes of the green pixels, and the light emitting diodes of the blue pixels include light emitting layers of different materials.

At least one of the pixels PX11 to PXnm includes a plurality of transistors and a capacitor connected to the transistors. At least one of the scan driving circuit SDC and the data driving circuit DDC may include a plurality of transistors formed through the same process as a pixel driving circuit.

The signal lines GWL1 to GWLn, GCL1 to GCLn, GBL1 to GBLn, and GIL1 to GILn, the pixels PX11 to PXnm, the scan driving circuit SDC, and the data driving circuit DDC may be formed on a base substrate through multiple photolithography processes.

Figure 2:
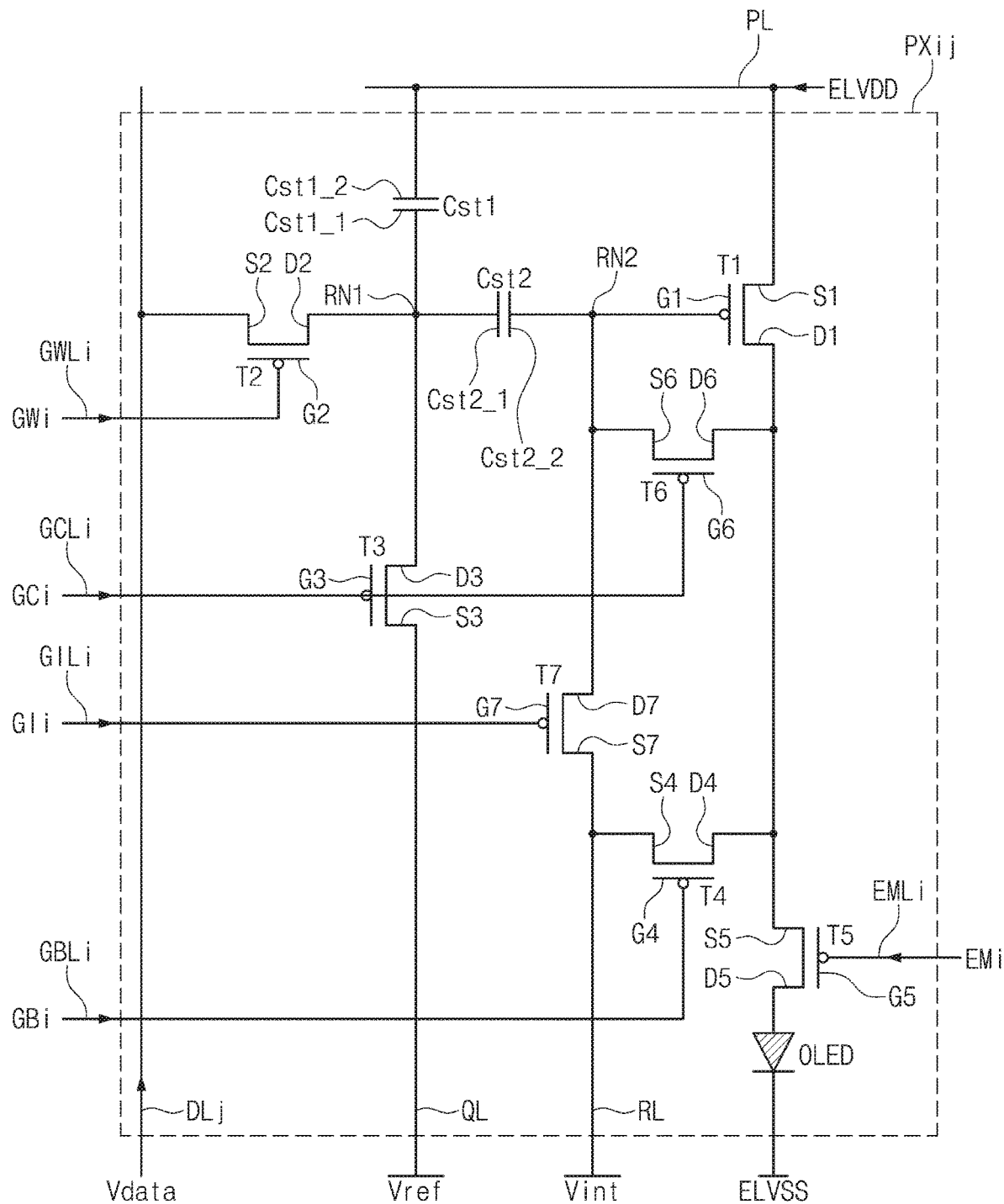
FIG. 2 is an equivalent circuit diagram showing a pixel according to an embodiment of the present disclosure.
Figure 3:
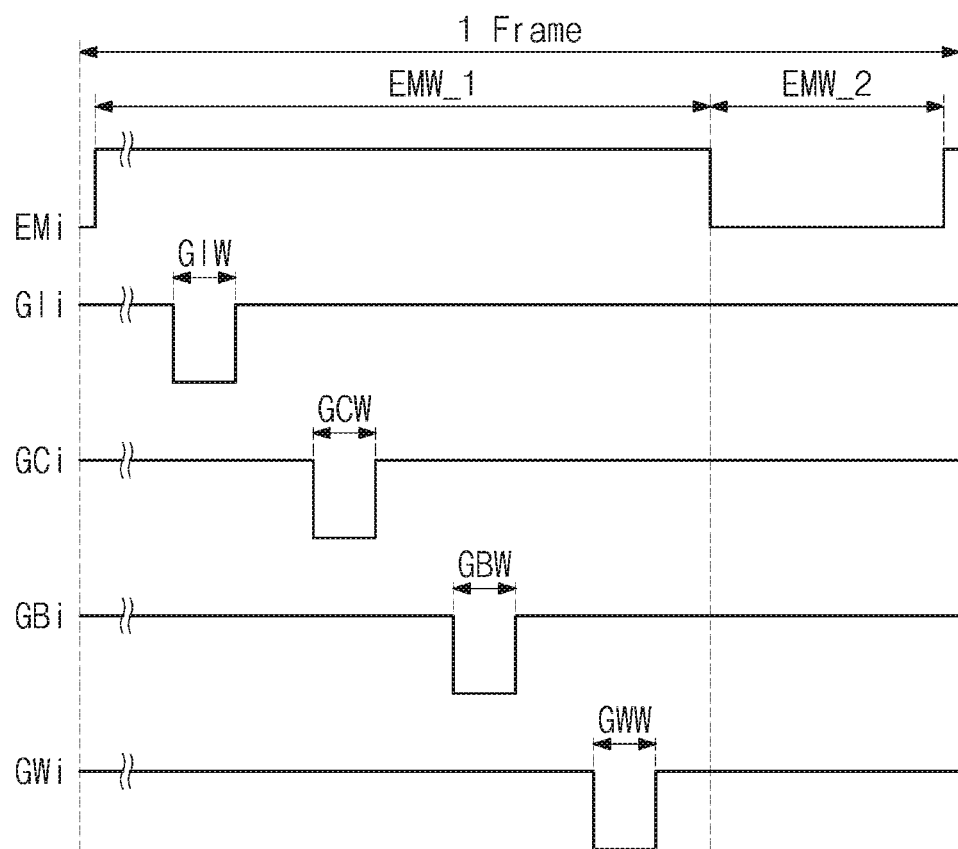
FIG. 3 is a waveform diagram showing driving signals used to drive the pixel shown in FIG. 2.
Figure 4:
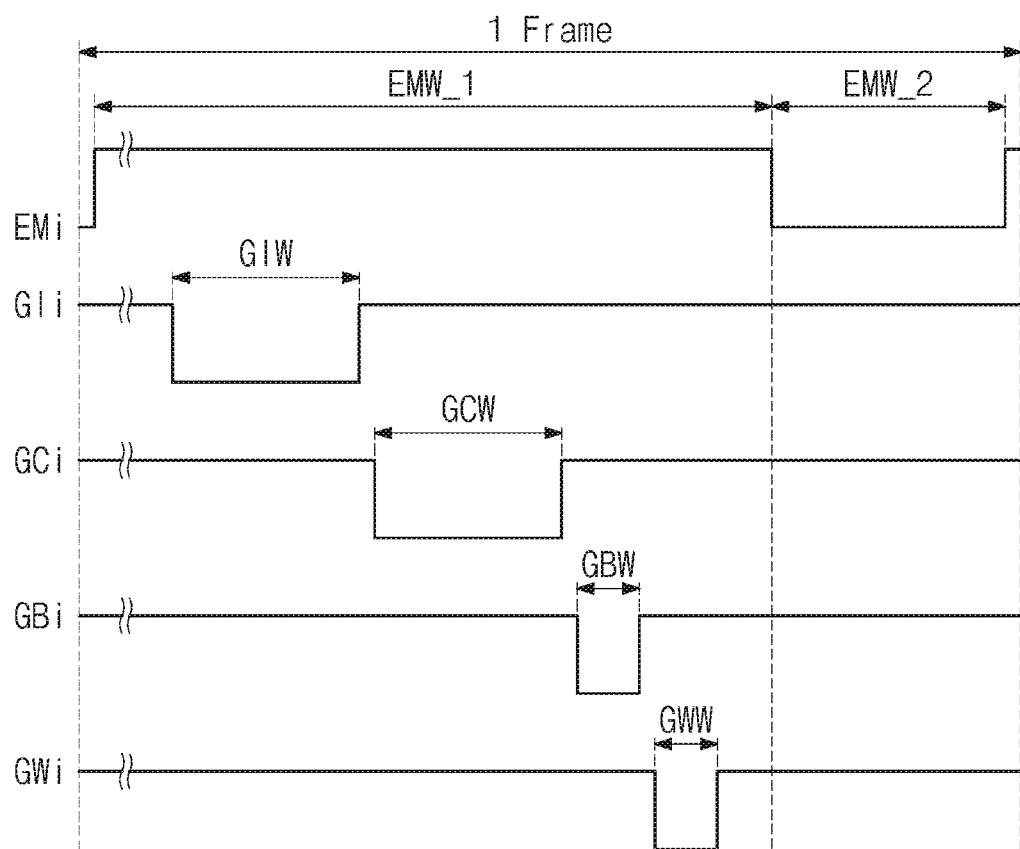
FIG. 4 is a waveform diagram showing driving signals used to drive the pixel shown in FIG. 2.
Figure 5:
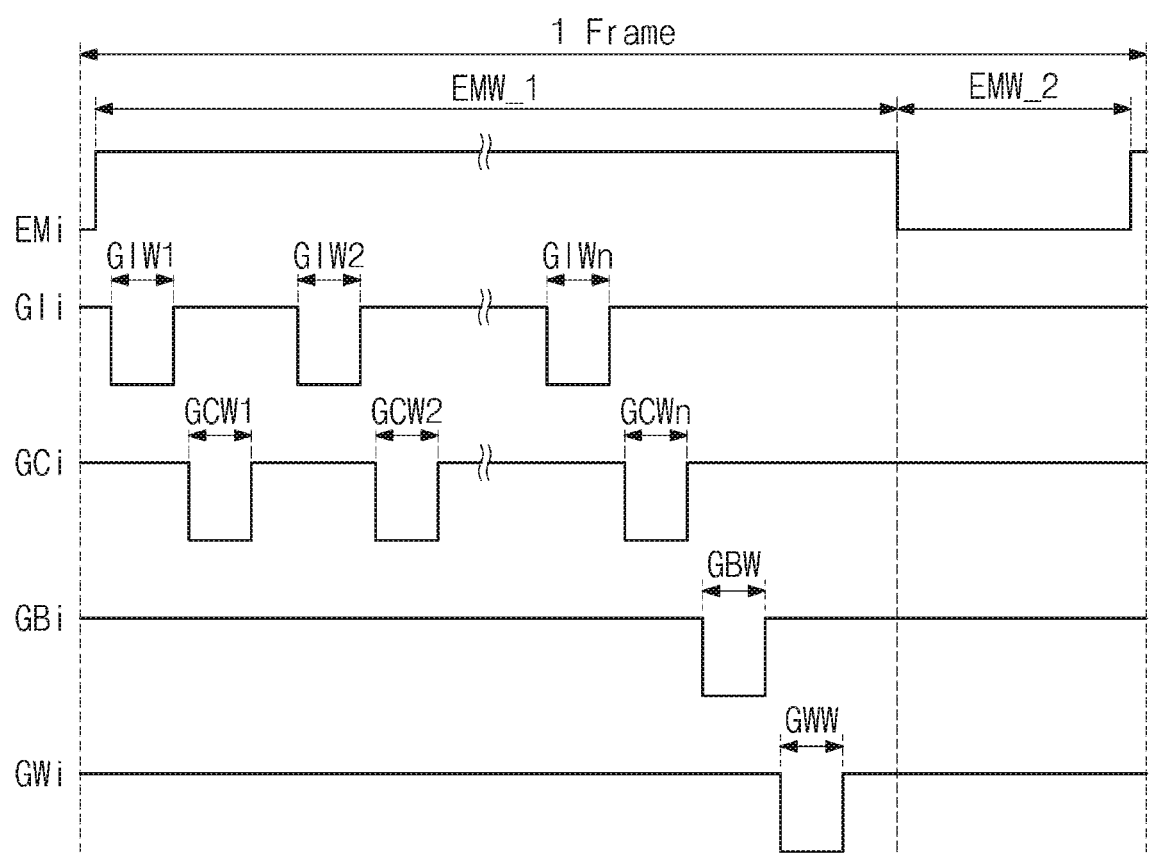
FIG. 5 is a waveform diagram showing driving signals used to drive the pixel shown in FIG. 2.

FIG. 2 is an equivalent circuit diagram showing a pixel PXij according to an embodiment of the present disclosure, and FIGS. 3 to 5 are waveform diagrams showing driving signals used to drive the pixel PXij shown in FIG. 2.

FIG. 2 shows the pixel PXij connected to an i-th write scan line GWLi among the write scan lines GWL1 to GWLn and a j-th data line DLj among the data lines DL1 to DLm.

In the present embodiment, the pixel PXij includes first, second, third, fourth, fifth, sixth, and seventh transistors T1, T2, T3, T4, T5, T6, and T7, first and second capacitors Cst1 and Cst2, and a light emitting diode OLED. In the present embodiment, each of the first to seventh transistors T1 to T7 is described as a P-type transistor, however, they should not be limited to the P-type transistor. Each of the first to seventh transistors T1 to T7 may be implemented by one of a P-type transistor and an N-type transistor. As another way, some transistors among the first to seventh transistors T1 to T7 may be implemented by the P-type transistor, and the other transistors among the first to seventh transistors T1 to T7 may be implemented by the N-type transistor. In addition, the number of the transistors included in the pixel PXij should not be limited to seven. That is, at least one of the first to seventh transistors T1 to T7 may be omitted or added to the pixel PXij.

In the present embodiment, the first transistor T1 is a driving transistor, and the second transistor T2 is a switching transistor. The first capacitor Cst1 is connected between the power line PL receiving the power source voltage ELVDD and a first reference node RN1. The first capacitor Cst1 includes a first electrode Cst1_1 connected to the first reference node RN1 and a second electrode Cst1_2 connected to the power line PL. The second capacitor Cst2 is connected between the first reference node RN1 and a second reference node RN2. The second capacitor Cst2 includes a first electrode Cst2_1 connected to the first reference node RN1 and a second electrode Cst2_2 connected to the second reference node RN2.

The first transistor T1 is connected between the power line PL and one electrode of the light emitting diode OLED. A source S1 of the first transistor T1 is electrically connected to the power line PL. In the present disclosure, the expression "a transistor is electrically connected to a signal line, or a transistor is electrically connected to a transistor" means that "any one of a source, a drain, and a gate of the transistor has an integral shape with the signal line or any one of the source, drain, and the gate of the transistor is connected to another transistor through a connection electrode". Another transistor may be further disposed between the source S1 of the first transistor T1 and the power line PL.

A drain D1 of the first transistor T1 is electrically connected to an anode of the light emitting diode OLED. Another transistor may be further disposed between the drain D1 of the first transistor T1 and the anode of the light emitting diode OLED. A gate G1 of the first transistor T1 is electrically connected to the second reference node RN2.

The second transistor T2 is connected between the j-th data line DLj and the first reference node RN1. A source S2 of the second transistor T2 is electrically connected to the j-th data line DLj, and a drain D2 of the second transistor T2 is electrically connected to the first reference node RN1. In the present embodiment, a gate G2 of the second transistor T2 is electrically connected to the i-th write scan line GW Li.

The third transistor T3 is connected between the first reference node RN1 and the reference voltage line QL. A drain D3 of the third transistor T3 is electrically connected to the first reference node RN1, and a source S3 of the third transistor T3 is electrically connected to the reference voltage line QL. In the present embodiment, a gate G3 of the third transistor T3 is electrically connected to an i-th compensation scan line GCLi.

The sixth transistor T6 is connected between the drain D1 of the first transistor T1 and the second reference node RN2. A source S6 of the sixth transistor T6 is electrically connected to the second reference node RN2, and a drain D6 of the sixth transistor T6 is electrically connected to the drain D1 of the first transistor T1. A gate G6 of the sixth transistor T6 is electrically connected to the i-th compensation scan line GCLi. In FIG. 2, the gate G3 of the third transistor T3 and the gate T6 of the sixth transistor T6 are commonly connected to the i-th compensation scan line GCLi, however, the present disclosure should not be limited thereto or thereby. According to another embodiment, the gate T6 of the sixth transistor T6 may be connected to a signal line different from a signal line to which the gate G3 of the third transistor T3 is connected. According to the embodiment, the sixth transistor T6 may include a plurality of gates.

The seventh transistor T7 is connected between the source S6 of the sixth transistor T6 and the initialization voltage line RL. A source S7 of the seventh transistor T7 is electrically connected to the initialization voltage line RL, and a drain D7 of the seventh transistor T7 is electrically connected to the source S6 of the sixth transistor T6. In the embodiment, a gate G7 of the seventh transistor T7 is connected to an i-th initialization scan line GILL According to the embodiment, the seventh transistor T7 may include a plurality of gates.

As the sixth transistor T6 and the seventh transistor T7 include the plural gates, a leakage current of the pixel PXij generated when the sixth and seventh transistors T6 and T7 are turned off may be reduced.

The fourth transistor T4 is connected between the drain D1 of the first transistor T1 and the source S7 of the seventh transistor T7. A drain D4 of the fourth transistor T4 is electrically connected to the drain D1 of the first transistor T1, and a source S4 of the fourth transistor T4 is electrically connected to the source S7 of the seventh transistor T7. In the embodiment of the present disclosure, a gate G4 of the fourth transistor T4 is electrically connected to an i-th black scan line GBLi.

The fifth transistor T5 is connected between the drain D1 of the first transistor T1 and the light emitting diode OLED. A source S5 of the fifth transistor T5 is electrically connected to the drain D1 of the first transistor T1 and the drain D4 of the fourth transistor T4, and a drain D5 of the fifth transistor T5 is electrically connected to the anode of the light emitting diode OLED. A gate G5 of the fifth transistor T5 is electrically connected to an i-th light emitting line EMLi.

The light emitting diode OLED is connected between a common electrode and the fifth transistor T5. A cathode of the light emitting diode OLED is electrically connected to the common electrode, and the anode of the light emitting diode OLED is electrically connected to the drain D5 of the fifth transistor T5.

FIG. 3 shows a waveform diagram of a portion of one frame period. Referring to FIGS. 1 and 3, the display device DD displays an image every frame period. Each of the write scan lines GWL1 to GWLn, the compensation scan lines GCL1 to GCLn, the black scan lines GBL1 to GBLn, the initialization scan lines GIL1 to GILn, and the light emitting lines EML1 to EMLn are sequentially scanned during one frame period. Referring to FIGS. 2 and 3, each of the signals Gli, GCi, GBi, and GWi and a light emitting signal EMi has a high level and a low level. Because the signal lines GWL1 to GWLn, GCL1 to GCLn, GBL1 to GBLn, and GIL1 to GILn and the light emitting lines EML1 to EMLn are electrically connected to the gates of the transistors, the N-type transistors are turned on when the signal lines GWL1 to GWLn, GCL1 to GCLn, GBL1 to GBLn, and GIL1 to GILn and the light emitting lines EML1 to EMLn have the high level, and the P-type transistors are turned on when the signal lines GWL1 to GWLn, GCL1 to GCLn, GBL1 to GBLn, and GIL1 to GILn and the light emitting lines EML1 to EMLn have the low level.

Among the initialization scan signals GI1 to GIn, an initialization scan signal provided to the i-th initialization scan line GILi is referred to as an i-th initialization scan signal Gli.

Among the compensation scan signals GC1 to GCn, an compensation scan signal provided to the i-th compensation scan line GCLi is referred to as an i-th compensation scan signal GCi.

Among the black scan signals GB1 to GBn, a black scan signal provided to the i-th black scan line GBLi is referred to as an i-th black scan signal GBi.

Among the data write signals GW1 to GWn, a data write signal provided to the i-th write scan line GWLi is referred to as an i-th data write signal GWi.

Among the light emitting signals EM1 to EMn, a light emitting signal provided to the i-th light emitting line EMLi is referred to as an i-th light emitting signal EMi.

In the present embodiment, the i-th light emitting signal EMi includes a non-light-emitting period EMW_1 having a high level and a light emitting period EMW_2 having a low level.

In the non-light-emitting period EMW_1 of the one frame(1 Frame), the i-th initialization scan signal Gli having the turn-on level (the low level) is provided to the gate of the seventh transistor T7 for initialization during an "initialization period GIW". The initialization period GIW is included in the non-light-emitting period EMW_1. When the seventh transistor T7 is turned on during the initialization period GIW, the initialization voltage Vint is applied to the gate G1 of the first transistor T1 through the seventh transistor T7. Accordingly, the second reference node RN2 connected to the gate G1 of the first transistor T1 is initialized to the initialization voltage Vint.

Then, the i-th compensation scan signal GCi having the turn-on level (the low level) is provided to the gate of the third transistor T3 and the sixth transistor T6 during a "compensation period GCW". In the compensation period GCW, the third transistor T3 and the sixth transistor T6 are turned on. In this case, the first transistor T1 is diode connected and is forward biased by the turned-on sixth transistor T6. Accordingly, a compensation voltage ELVDD-Vth, which is reduced by a threshold voltage Vth of the first transistor T1 from the power source voltage ELVDD provided from the power line PL, is applied to the gate G1 of the first transistor T1. That is, a voltage of the second reference node RN2 may be the compensation voltage ELVDD-Vth. Simultaneously, when the third transistor T3 is turned on in the compensation period GCW the reference voltage Vref is applied to the drain D2 of the second transistor T2 through the third transistor T3. Accordingly, a voltage of the first reference node RN1 connected to the drain D2 of the second transistor T2 may have the reference voltage Vref.

The i-th data write signal GWi having the turn-on level (the low level) is provided to the gate of the second transistor T2 during a "write period GWW". When the second transistor T2 is turned on in the write period GWW, the data voltage Vdata corresponding to data is applied to the drain D3 of the third transistor T3 through the second transistor T2. Accordingly, a voltage of the first reference node RN1 connected to the drain D3 of the third transistor T3 may have the data voltage Vdata.

The power source voltage ELVDD and the data voltage Vdata are respectively applied to two electrodes of the first capacitor Cst1, and the first capacitor Cst1 is charged with a voltage difference between the two electrodes of the first capacitor Cst1 (ELVDD-Vdata).

The data voltage Vdata and the compensation voltage ELVDD-Vth are applied to two electrodes of the second capacitor Cst2, and the second capacitor Cst2 is charged with a voltage difference between the two electrode of the second capacitor Cst2 (ELVDD-Vth-Vdata).

In this case, the voltage of the first reference node RN1 is changed to the data voltage Vdata that is the voltage when the second transistor T2 is turned on from the reference voltage Vref that is the voltage when the third transistor T3 is turned on. A voltage change amount (Vdata-Vref) of the first reference node RN1 is transmitted to the second reference node RN2 due to a coupling effect of the second capacitor Cst2. That is, the voltage of the second reference node RN2 may be a value (Vdata+ELVDD-Vth-Vref) obtained by adding the voltage change amount (Vdata-Vref) of the first reference node RN1 when the second transistor T2 is turned on to the compensation voltage ELVDD-Vth that is the voltage when the sixth transistor T6 is turned on.

Then, the fifth transistor T5 is turned on during the light emitting period EMW_2. Accordingly, a driving current Id is generated due to a difference in voltage between a gate voltage of the gate G1 of the first transistor T1 and a source voltage of the source S1 of the first transistor T1, the driving current Id is provided to the light emitting diode OLED through the fifth transistor T5, and as a result, a current flows through the light emitting diode OLED. During the light emitting period EMW_2, a gate-source voltage Vgs of the first transistor T1 is maintained in a value ELVDD-(Vdata+ELVDD-Vth-Vref) by the second capacitor Cst2, and according to a current-voltage relationship of the first transistor T1, the driving current Id of the first transistor T1 is proportional to a square of a value, i.e., $(Vdata-vref)^2$, obtained by subtracting the threshold voltage Vth of the first transistor T1 from the gate-source voltage Vgs of the first transistor T1. Thus, the driving current Id may be determined regardless of the threshold voltage Vth of the first transistor T1.

The data signals output from the data driving circuit DDC are written in the display panel DP of the display device DD, and thus, the light emitting diode OLED emits the light. A frequency at which the data signals Vdata are written is called an operating frequency. A frequency of the write period GWW where the second transistor T2 electrically connected to the j-th data line DLj is turned on to write the data signals Vdata is substantially the same as the operating frequency.

The gate G6 of the sixth transistor T6 and the gate G2 of the second transistor T2 are connected to different signal lines. Through this, the gate G1 and the drain D1 of the first transistor T1 are diode-connected, and thus, a timing for applying the compensation voltage ELVDD-Vth to the gate G1 of the first transistor T1 and a timing for applying the data voltage Vdata of the data line DL to the first reference node RN1 through the second transistor T2 can be controlled independently. That is, the compensation period GCW and the write period GWW do not overlap each other. Since the operation of compensating for the threshold voltage Vth of the first transistor T1 through the sixth transistor T6 and the operation of writing the data in the first reference node RN1 through the second transistor T2 are performed in different periods from each other, each operation is not affected by other operations. Although the write period GWW of the i-th data write signal GWi is determined by the operating frequency of the display device DD (refer to FIG. 1), the compensation period GCW of the i-th compensation scan signal GCi may be determined regardless of the write period GWW. The compensation period GCW may have substantially the same width as that of the write period GWW determined by the operating frequency.

As another example, referring to FIG. 4, the compensation period GCW may be wider than the write period GWW. Accordingly, although the display device DD has a high operating frequency, an operation to compensate for the threshold voltage Vth of the first transistor Tr is able to be done through sufficient compensation period GCW.

Then, the i-th black scan signal GBi having the turn-on level (the low level) is provided to the gate of the fourth transistor T4 for initializing the drain of the first transistor T1 during a "black period GBW". When the fourth transistor T4 is turned on in the black period GBW, the initialization voltage Vint is provided to the drain D1 of the first transistor T1 through the fourth transistor T4. Accordingly, a voltage of the drain D1 of the first transistor T1 may have the initialization voltage Vint. When the fifth transistor T5 is turned on and the driving current Id flows through the light emitting diode OLED, the light emitting diode OLED may be prevented from emitting light momentarily due to a voltage remaining in the drain D1 of the first transistor T1 and flowing into the anode of the light emitting diode OLED.

In the non-light-emitting period EMW_1, after the third and sixth transistors T3 and T6 are turned on in response to the compensation period GCW, the fourth transistor T4 is turned on in the black period GBW. When the sixth transistor T6 is turned on, the drain D1 of the first transistor T1 is connected to the gate G1 of the first transistor T1 in a diode configuration, and the compensation voltage ELVDD-Vth is applied to the drain D1. When the fourth transistor T4 is turned on, the initialization voltage Vint is applied to the drain D1 of the first transistor T1 through the fourth transistor T4, and thus, the compensation voltage ELVDD-Vth is initialized to the initialization voltage Vint.

The fourth transistor T4 is turned on in the black period GBW before the second transistor T2 is turned on in the write period GWW. When the second transistor T2 is turned on, the voltage (Vdata+ELVDD-Vth−Vref) is applied to the gate G1 of the first transistor T1, which is electrically connected to the second reference node RN2. Accordingly, the first transistor T1 is turned on, and the turned-on state of the first transistor T1 is maintained by the electric charge stored in the second capacitor Cst2. When the first transistor T1 is turned on, the power source voltage ELVDD provided through the power line PL electrically connected to the source S1 is applied to the drain D1.

When the fourth transistor T4 is turned on, the initialization voltage Vint is applied to the drain D1 of the first transistor T1 through the fourth transistor T4. Accordingly, the fourth transistor T4 is turned on before the power source voltage ELVDD is applied to the drain D1 of the first transistor T1.

FIGS. 4 and 5 are waveform diagrams showing the driving signals to drive the pixel shown in FIG. 2.

Referring to FIG. 4, the initialization period GIW is wider than the black period GBW and the write period GWW. The compensation period GCW is wider than the black period GBW and the write period GWW. The influence of previous data may be reduced by widening the initialization period GIW and the compensation period GCW through the initialization of the voltage of the gate G1 of the first transistor T1 and the application of the compensation voltage ELVDD-Vth.

Referring to FIG. 5, the initialization periods GIW1 to GIWn and compensation periods GCW1 to GCWn are repeated multiple times in one frame. The influence of the previous data may be reduced by repeating the initialization periods GIW1 to GIWn and the compensation periods GCW1 to GCWn through the initialization of the voltage of the gate G1 of the first transistor T1 and the application of the compensation voltage ELVDD-Vth.

Figure 6:
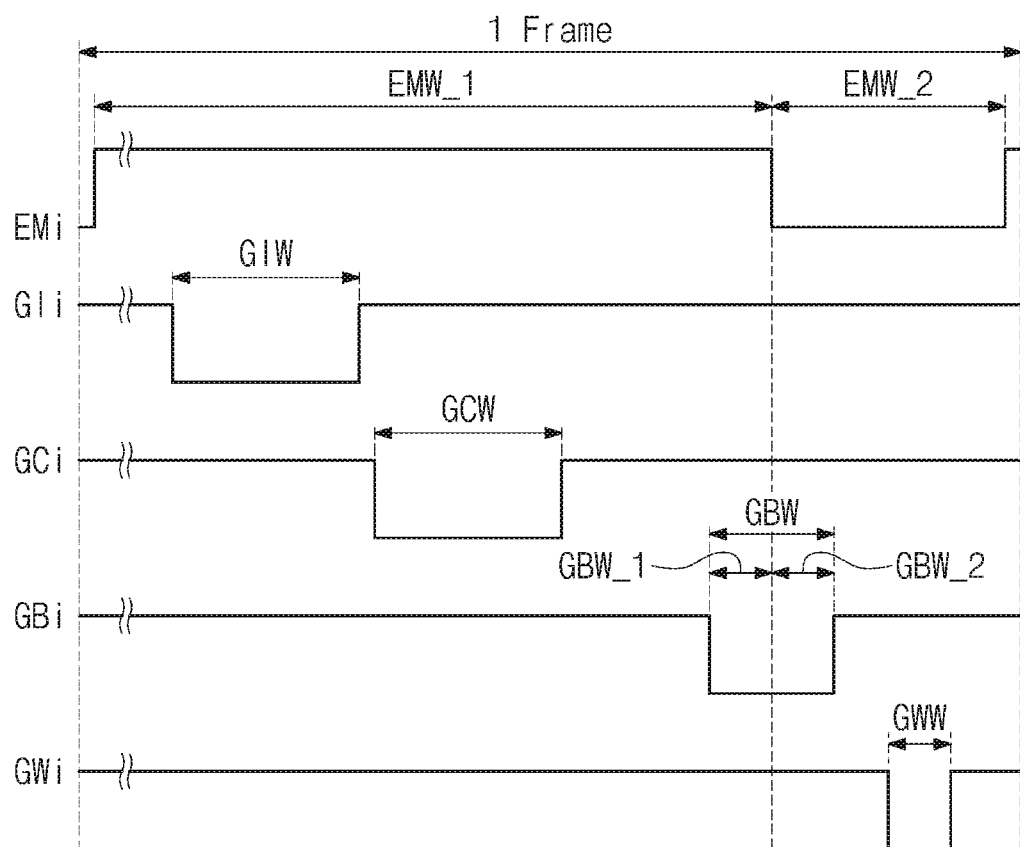
FIG. 6 is a waveform diagram showing driving signals used to drive the pixel shown in FIG. 2.
Figure 7:
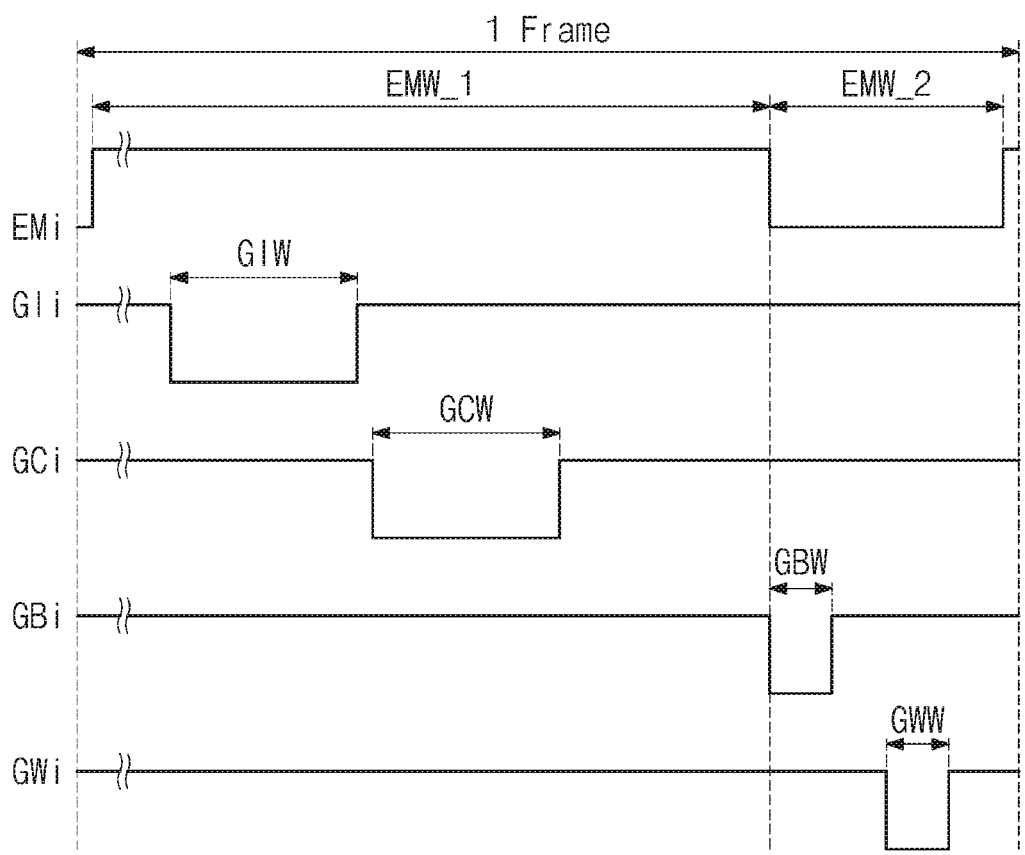
FIG. 7 is a waveform diagram showing driving signals used to drive the pixel shown in FIG. 2.
Figure 8A:
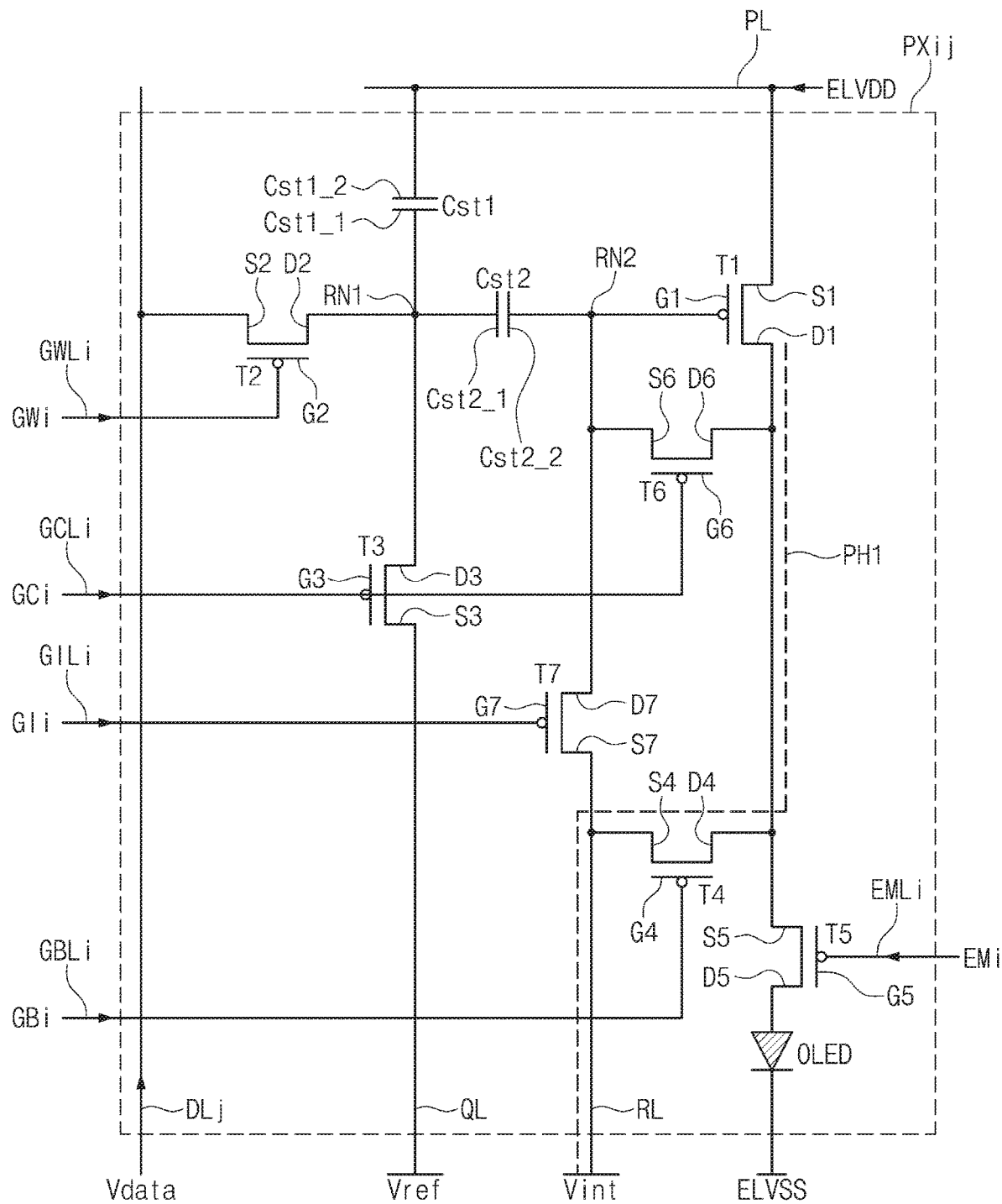
FIG. 8A is an equivalent circuit diagram showing an initialization operation of a drain voltage of a driving transistor.
Figure 8B:
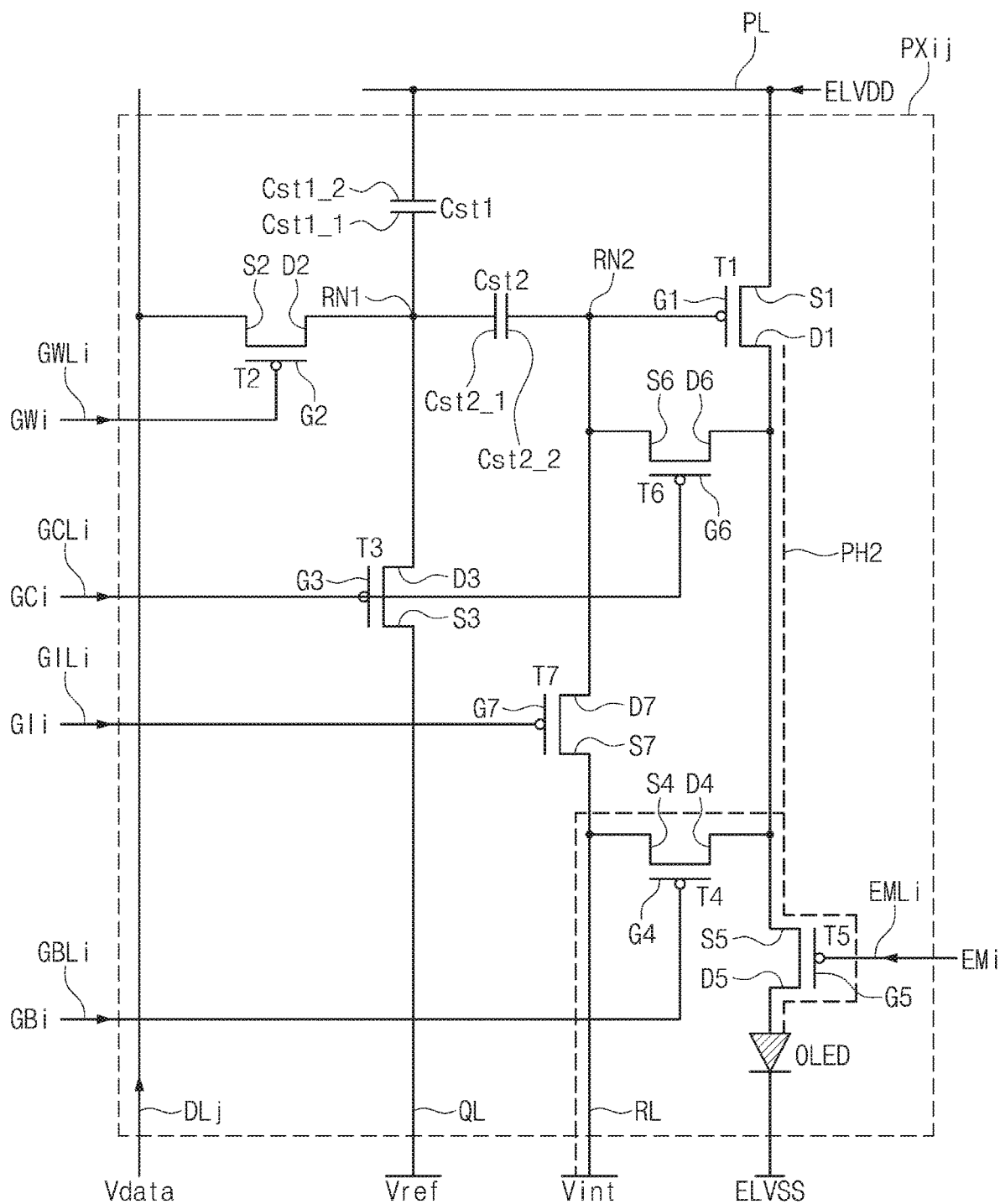
FIG. 8B is an equivalent circuit diagram showing an initialization operation of an anode voltage of a light emitting diode.

FIGS. 6 and 7 are waveform diagrams showing driving signals to drive the pixel shown in FIG. 2. FIG. 8A is an equivalent circuit diagram showing an initialization operation of a drain voltage of a driving transistor. FIG. 8B is an equivalent circuit diagram showing an initialization operation of an anode voltage of a light emitting diode.

Referring to FIGS. 6, 8A, and 8B, the black period GBW overlaps the non-light-emitting period EMW_1 and the light emitting period EMW_2. The fourth transistor T4 is turned on in the black period GBW_1 overlapping the non-light-emitting period EMW_1, and a path PH1 through which the initialization voltage Vint is applied to the drain D1 of the first transistor T1 through the fourth transistor T4 is formed. Accordingly, the voltage of the drain D1 of the first transistor T1 is initialized.

The fourth transistor T4 and the fifth transistor T5 are simultaneously turned on in the black period GBW_2 overlapping the light emitting period EMW_2. Through this, a path PH2 in which the initialization voltage Vint is applied to the drain D1 of the first transistor T1 through the fourth transistor T4 and applied to the drain D5 of the fifth transistor T5 through the fourth transistor and the fifth transistor T5 is formed. Accordingly, the voltage of the drain D1 of the first transistor T1 and the voltage of the anode of the light emitting diode OLED are initialized. Therefore, when the fifth transistor T5 is turned on, the light emitting diode OLED may be prevented from emitting light momentarily due to current flow through the light emitting diode OLED because of a voltage remained in the drain D1 of the first transistor T1. In addition, a leakage current flowing through the first transistor T1 even when the first transistor T1 is turned off may be discharged through the fourth transistor T4, and as a result, a contrast ratio of the display panel DP may be improved by implementing a real black image. A ratio of the black period GBW_1 that overlaps the non-light-emitting period EMW_1 and the black period GBW_2 that overlaps the light emitting period EMW_2 is not limited to that shown in figures. The fourth transistor T4 is turned on in the black period GBW before the second transistor T2 is turned on in response to the data writing signal GWi in the write period GWW. The write period GWW may overlap the light emitting period EMW_2.

As an example of the present disclosure, referring to FIG. 7, the black period GBW completely overlaps with the light emitting period EMW_2. In this case, the voltage of the drain D1 of the first transistor T1 and the voltage of the anode of the light emitting diode OLED are initialized in the black period GBW that completely overlaps with the light emitting period EMW_2.

Figure 9:
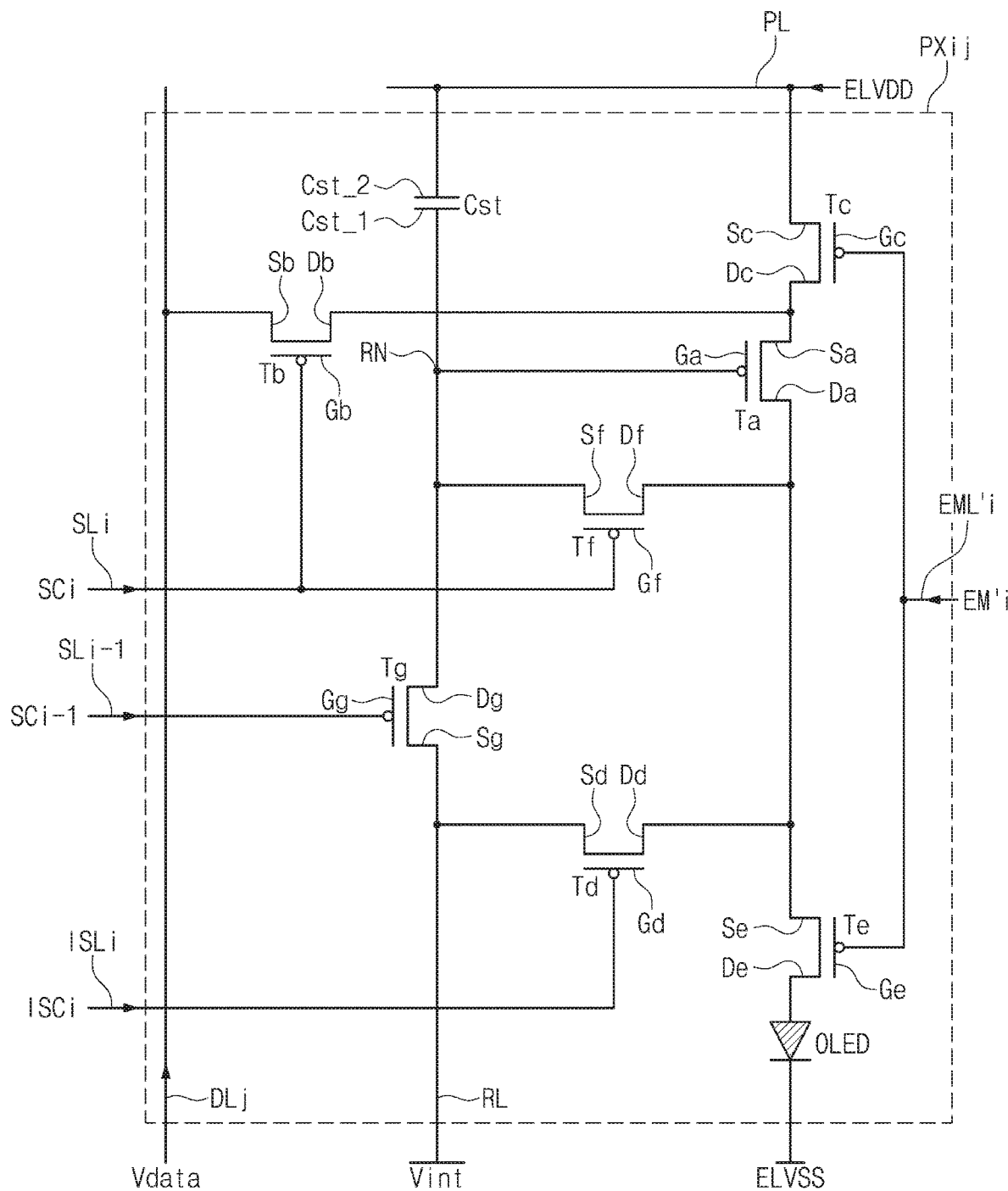
FIG. 9 is an equivalent circuit diagram showing a pixel according to an embodiment of the present disclosure.
Figure 10:
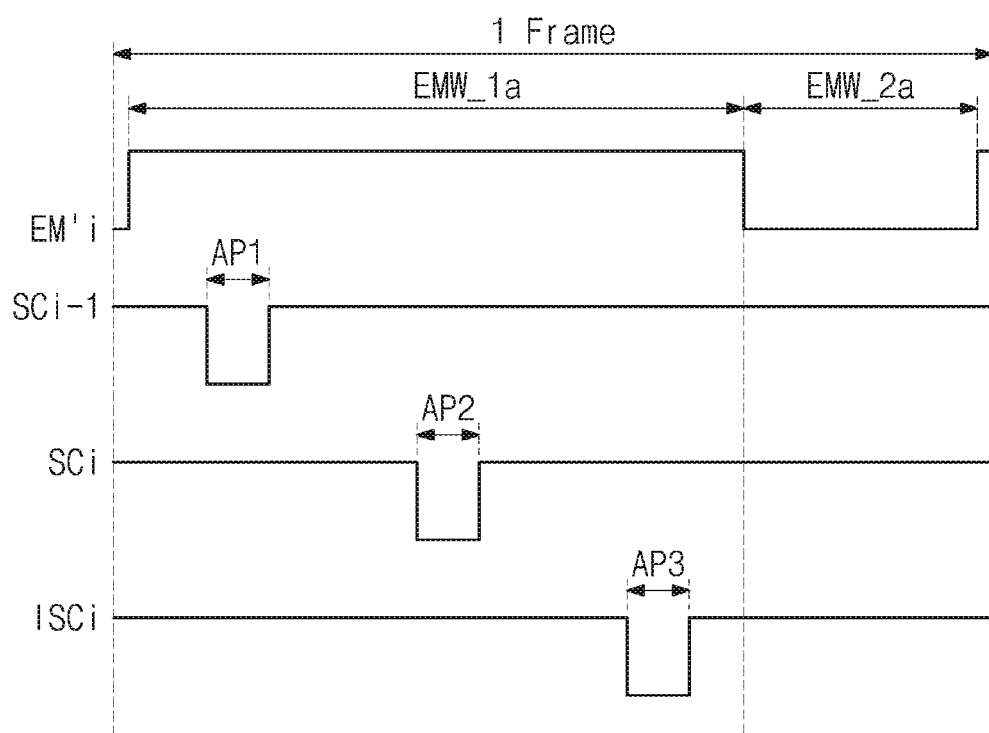
FIG. 10 is a waveform diagram showing driving signals used to drive the pixel shown in FIG. 9.

FIG. 9 is an equivalent circuit diagram showing a pixel PXij according to an embodiment of the present disclosure. FIG. 10 is a waveform diagram showing driving signals used to drive the pixel PXij shown in FIG. 9.

FIG. 9 shows the pixel PXij connected to an i-th scan line SLi among scan lines and a j-th data line DLj among data lines as a representative example.

In the present embodiment, the pixel PXij includes first, second, third, fourth, fifth, sixth, and seventh transistors Ta, Tb, Tc, Td, Te, Tf, and Tg and a light emitting diode OLED. In the present embodiment, each of the first to seventh transistors Ta to Tg is described as a P-type transistor, however, they should not be limited to the P-type transistor. Each of the first to seventh transistors Ta to Tg may be implemented by one of a P-type transistor and an N-type transistor. As another way, some transistors among the first to seventh transistors Ta to Tg may be implemented by the P-type transistor, and the other transistors among the first to seventh transistors Ta to Tg may be implemented by the N-type transistor. In addition, the number of the transistors included in the pixel PXij should not be limited to seven. That is, at least one of the first to seventh transistors Ta to Tg may be omitted, and as another way, one or more transistors may be added to the pixel PXij. In the present embodiment, the first transistor Ta is a driving transistor, and the second transistor Tb is a switching transistor. A capacitor Cst is connected between a power line PL that receives a power source voltage ELVDD and a reference node RN. The capacitor Cst includes a first electrode Cst_1 connected to the reference node RN and a second electrode Cst_2 connected to the power line PL.

The first transistor Ta is connected between the power line PL and one electrode of the light emitting diode OLED. A source Sa of the first transistor Ta is electrically connected to the power line PL. In the present disclosure, the expression "a transistor is electrically connected to a signal line, or a transistor is electrically connected to a transistor" means that "any one of a source, a drain, and a gate of the transistor has an integral shape with the signal line or any one of the source, drain, and the gate of the transistor is connected to another transistor through a connection electrode". Another transistor may be further disposed between the source Sa of the first transistor Ta and the power line PL.

A drain Da of the first transistor Ta is electrically connected to an anode of the light emitting diode OLED. Another transistor may be further disposed between the drain Da of the first transistor Ta and the anode of the light emitting diode OLED. A gate Ga of the first transistor Ta is electrically connected to the reference node RN.

The second transistor Tb is connected between the j-th data line DLj and the source Sa of the first transistor Ta. A source Sb of the second transistor Tb is electrically connected to the j-th data line DLj, and a drain Db of the second transistor Tb is electrically connected to the source Sa of the first transistor Ta. In the present embodiment, a gate Gb of the second transistor Tb is electrically connected to the i-th scan line SLi.

The third transistor Tc is connected between the power line PL and the source Sa of the first transistor Ta. A source Sc of the third transistor Tc is electrically connected to the power line PL, and a drain Dc of the third transistor Tc is electrically connected to the source Sa of the first transistor Ta. In the present embodiment, a gate Gc of the third transistor Tc is electrically connected to an i-th light emitting line EML'i.

The sixth transistor Tf is connected between the reference node RN and the drain Da of the first transistor Ta. A source Sf of the sixth transistor Tf is electrically connected to the reference node RN, and a drain Df of the sixth transistor Tf is electrically connected to the drain Da of the first transistor Ta. In the present embodiment, a gate Gf of the sixth transistor Tf is electrically connected to the i-th scan line SLi. The sixth transistor Tf may include a plurality of gates.

The seventh transistor Tg is connected between the reference node RN and an initialization voltage line RL. A drain Dg of the seventh transistor Tg is electrically connected to the reference node RN, and a source Sg of the seventh transistor Tg is electrically connected to the initialization voltage line RL. In the present embodiment, a gate Gg of the seventh transistor Tg is electrically connected to an (i-1)th scan line SLi-1. The seventh transistor Tg may include a plurality of gates.

As the sixth and seventh transistors Tf and Tg include plural gates, a leakage current generated when the sixth and seventh transistors Tf and Tg are turned off may be reduced.

The fourth transistor Td is connected between the drain Da of the first transistor Ta and the source Sg of the seventh transistor Tg. A source Sd of the fourth transistor Td is electrically connected to the source Sg of the seventh transistor Tg, and a drain Dd of the fourth transistor Td is electrically connected to the drain Da of the first transistor Ta. A gate Gd of the fourth transistor Td is electrically connected to an i-th initialization scan line ISLi.

The fifth transistor Te is connected between the drain Da of the first transistor Ta and the light emitting diode OLED. A source Se of the fifth transistor Te is electrically connected to the drain Da of the first transistor Ta and the drain Dd of the fourth transistor Td, and a drain De of the fifth transistor Te is electrically connected to the anode of the light emitting diode OLED. A gate Ge of the fifth transistor Te is electrically connected to the i-th light emitting line EML'i. According to another embodiment, the gate Gc of the third transistor Tc may be connected to a different signal line from the signal line to which the gate Ge of the fifth transistor Te is connected.

The light emitting diode OLED is connected between a common electrode and the fifth transistor Te. A cathode of the light emitting diode OLED is electrically connected to the common electrode, and the anode of the light emitting diode OLED is electrically connected to the drain De of the fifth transistor Te.

FIG. 10 shows a portion of one frame period. Referring to FIGS. 9 and 10, the display device DD displays an image every frame period. Each of the scan lines, initialization scan lines, and light emitting lines are sequentially scanned for one frame period.

Referring to FIGS. 9 and 10, each of the signals SCi-1, SCi, and ISCi and a light emitting signal EM'i has a high level and a low level. Because the scan lines SLi and SLi-1, and the initialization scan line ISLi and the light emitting line EML'i are electrically connected to the gates of the transistors, the N-type transistors are turned on when the scan lines SLi and SLi-1, and the initialization scan line ISLi and the light emitting line EML'i have the high level, and the P-type transistors are turned on when the scan lines SLi and SLi-1, and the initialization scan line ISLi and the light emitting line EML'i have the low level. The light emitting signal EM'i includes a non-light-emitting period EMW_1a and a light emitting period EMW_2a.

During the non-light-emitting period EMW_1a of the one frame(1 Frame), a previous scan signal SCi-1 having the turn-on level(the low level) is provided to the gate of the seventh transistor Tg during a "previous scan period AP1". When the seventh transistor Tg is turned on during the previous scan period AP1, an initialization voltage Vint is applied to the gate Ga of the first transistor Ta through the seventh transistor Tg. Accordingly, the reference node RN connected to the gate Ga of the first transistor Ta is initialized to the initialization voltage Vint.

Then, a scan signal SCi having the turn-on level(the low level) is provided to the gate of the second transistor Tb and the sixth transistor Tf during a "scan period AP2". The second and sixth transistors Tb and Tf are turned on in the scan period AP2. A data voltage Vdata corresponding to data is applied to the source Sa of the first transistor Ta through the second transistor Tb. In this case, the first transistor Ta is diode connected and is forward biased by the turned-on sixth transistor Tf. Accordingly, a compensation voltage Vdata-Vth reduced by a threshold voltage Vth of the first transistor Ta from the data voltage Vdata applied to the source Sa of the first transistor Ta is applied to the gate Ga of the first transistor Ta. That is, a voltage of the reference node RN may have the compensation voltage Vdata-Vth. Accordingly, the first transistor Ta is turned on, and the turned-on state of the first transistor Ta is maintained by electric charges stored in the capacitor Cst.

Next, an initialization scan signal ISCi having the turn-on level(the low level) is provided to the gate of the fourth transistor Td during an "initialization period AP3". The fourth transistor Td is turned on in the initialization period AP3. The initialization voltage Vint is applied to the drain Da of the first transistor Ta through the fourth transistor Td, and the voltage of the drain Da of the first transistor Ta is initialized to the initialization voltage Vint from the compensation voltage ELVDD-Vth.

Then, the light emitting signal EM'i having the turn-on level(the low level) is provided to a gate of the third transistor Tc and the fifth transistor Te during the "light emitting period EMW_2a". The third and fifth transistors Tc and Te are turned on during the light emitting period EMW_2a, and a driving current Id flows through the light emitting diode OLED.

Figure 11:
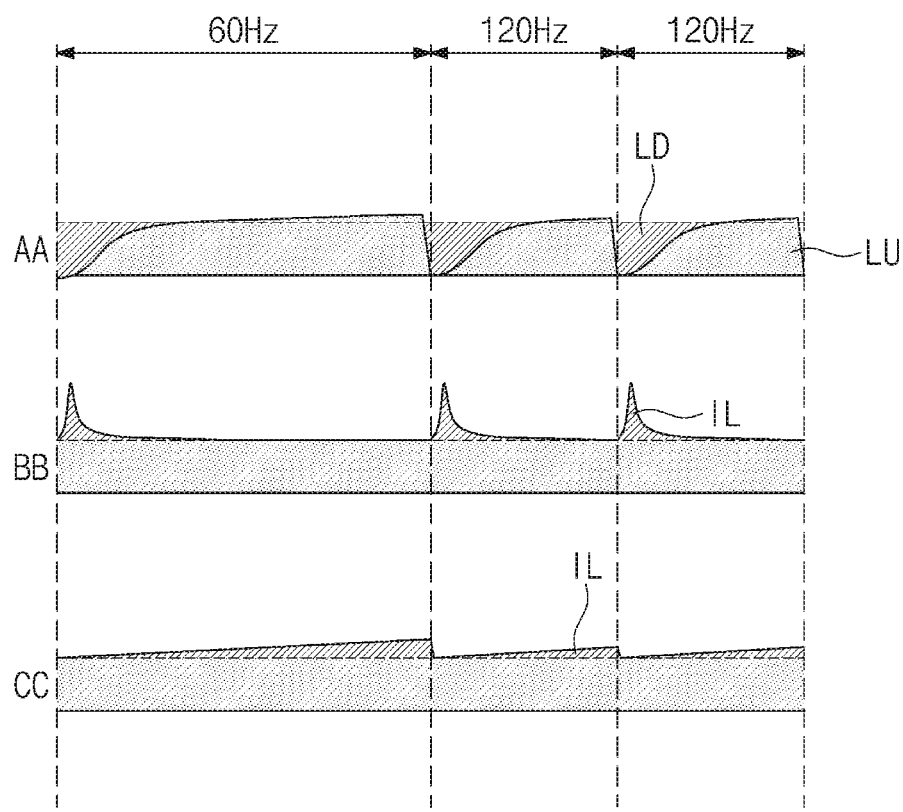
FIG. 11 is a waveform diagram showing a luminance of a pixel at each driving frequency according to an embodiment of the present disclosure.

FIG. 11 is a waveform diagram showing a luminance of a pixel at each driving frequency according to an embodiment of the present disclosure.

Referring to FIGS. 2, 10, 11, an operation that initializes the anode of the light emitting diode OLED is referred to as a "first driving AA", an operation that does not initialize the anode of the light emitting diode OLED is referred to as a "second driving BB", and an operation that does not initialize the anode of the light emitting diode OLED but initializes the drains D1 and Da of the first transistors T1 and Ta is referred to as a "third driving CC".

The light emitting diode OLED emits a light to have a certain amount of luminance LU corresponding to the data voltage Vdata applied thereto. An amount of the light emitted by the light emitting diode OLED for a certain period of time is referred to as a light emission amount LUM. In the case of the first driving AA, since the anode of the light emitting diode OLED is initialized, a certain period of time is required until the light emitting diode OLED emits the light with the certain amount of luminance LU, and this is called a "light emission delay LD". In the case of the second driving BB, the light emission delay LD does not occur because the anode of the light emitting diode OLED is not initialized. However, when the voltage remaining in the drain D1 of the driving transistor T1 flows into the light emitting diode OLED, the light emitting diode OLED momentarily emits the light with high luminance at the beginning of the second driving BB, and this is called an "instantaneous light emission IL". In a case where the operating frequency of the display device DD (refer to FIG. 1) is changed to about 120 Hz from about 60 Hz, the influence of the light emission delay LD at the operating frequency of about 120 Hz is greater than that at the operating frequency of about 60 Hz in the first driving AA. Accordingly, the light emission amount LUM of the display device DD when the display device DD is driven at about 120 Hz is less than the light emission amount LUM of the display device DD when the display device DD is driven at about 60 Hz, and thus, a difference in the light emission amount LUM when the operating frequency is changed is recognized by a viewer.

In the case of the second driving BB, the influence of the instantaneous light emission IL at the operating frequency of about 120 Hz is greater than that at the operating frequency of about 60 Hz. Accordingly, the light emission amount LUM of the display device DD when the display device DD is driven at about 120 Hz is greater than the light emission amount LUM of the display device DD when the display device DD is driven at about 60 Hz, and thus, a difference in the light emission amount LUM when the operating frequency is changed is recognized by a viewer.

In the case of the third driving CC, the influence of the light emission delay LE and the instantaneous light emission IL on the light emitting diode OLED is small, and thus, the difference in the light emission delay LE and the instantaneous light emission IL between the operating frequency of about 60 Hz and the operating frequency of about 120 Hz is small. Accordingly, the difference in the light emission amount LUM when the operating frequency is changed is not recognized by a viewer. That is, since the transistor that transmits the initialization voltage Vint is not connected to the anode of the light emitting diode OLED, the light emission delay LD may be prevented from occurring. In addition, as the fourth transistors T4 and Td that transmit the initialization voltage Vint are respectively connected to the drains D1 and Da of the first transistors T1 and Ta, the instantaneous light emission IL may be prevented from occurring. Accordingly, when the light emitting diode OLED emits the light, the difference in the light emission amount LUM that is recognized by the viewer and caused by the voltage remaining in the drains D1 and Da of the first transistors T1 and Ta and flowing into the light emitting diode OLED, i.e., a flicker phenomenon, may be prevented from occurring.

As shown in FIG. 11, the driving that does not initialize the anode of the light emitting diode OLED and the driving that initializes the drains D1 and Da of the first transistors T1 and Ta may prevent the display quality of the display device DD from being deteriorated due to the light emission amount LUM of the light emitting diode OLED according to the change of the operating frequency of the driving device DD. To this end, a connection structure of the fourth transistors T4 and Td that are electrically connected between the anode of the light emitting diode OLED and the initialization voltage line RL in a conventional display device DD may be changed to a connection structure in which the fourth transistors T4 and Td are electrically connected between the drains D1 and Da of the first transistors T1 and Ta and the initialization voltage line RL.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:
1. A display device comprising:
a display panel comprising a plurality of pixels, at least one of the pixels comprising:
a light emitting diode;
a capacitor connected between a power line receiving a power source voltage and a reference node;
a first transistor connected between the power line and an anode of the light emitting diode;
a second transistor connected between a data line and a source of the first transistor and turned on in response to a scan signal;
a third transistor connected between the power line and the source of the first transistor;
a fourth transistor connected between a drain of the first transistor and an initialization voltage line receiving an initialization voltage and turned on in response to an initialization scan signal; and
a fifth transistor connected between the drain of the first transistor and the anode of the light emitting diode, wherein a scan period of the scan signal precedes an initialization period of the initialization scan signal.

2. The display device of claim 1, wherein the first transistor comprises:
a source connected to a drain of the second transistor; and
a gate connected to the reference node,
wherein the second transistor comprises:
a gate receiving the scan signal; and
a source connected to the data line, and
wherein the third transistor comprises;
a gate receiving a light emitting signal;
a source connected to the power line; and
a drain connected to the source of the first transistor.

3. The display device of claim 2, further comprising:
a sixth transistor connected between the drain of the first transistor and the reference node; and
a seventh transistor connected between the reference node and the initialization voltage line,
wherein the fourth transistor comprises:
a source connected to a source of the seventh transistor;
a drain connected to the drain of the first transistor; and
a gate receiving the initialization scan signal,
wherein the fifth transistor comprises:
a source connected to the drain of the fourth transistor; and
a gate receiving the light emitting signal, and
wherein the seventh transistor comprises:
a gate receiving a previous scan signal; and
the source connected to the source of the fourth transistor.

4. The display device of claim 3, wherein the scan period precedes the initialization period, and the scan period and the initialization period are in a non-light-emitting period of the light emitting signal in one frame.

\* \* \* \* \*